(12) United States Patent
Hirotsu et al.

(10) Patent No.: US 11,430,796 B2
(45) Date of Patent: Aug. 30, 2022

(54) SRAM LAYOUT SCHEME FOR IMPROVING WRITE MARGIN

(71) Applicant: Winbond Electronics Corp., Taichung (TW)

(72) Inventors: Junichi Hirotsu, Taichung (TW); Daiki Ito, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/830,983

(22) Filed: Mar. 26, 2020

(65) Prior Publication Data

US 2020/0321343 A1 Oct. 8, 2020

(30) Foreign Application Priority Data

Apr. 4, 2019 (JP) .............................. JP2019-071739

(51) Int. Cl.
*G11C 5/02* (2006.01)
*H01L 27/11* (2006.01)
(Continued)

(52) U.S. Cl.
CPC .......... *H01L 27/1104* (2013.01); *G11C 5/025* (2013.01); *G11C 5/06* (2013.01);
(Continued)

(58) Field of Classification Search
CPC ............. H01L 27/1104; H01L 27/0207; G11C 11/419; G11C 11/412; G11C 5/025; G11C 5/06; G11C 5/146
See application file for complete search history.

(56) References Cited

U.S. PATENT DOCUMENTS 7,535,788 B2 5/2009 Wu et al.
2001/0038552 A1* 11/2001 Ishimaru ............... G11C 11/419
365/181
(Continued)

FOREIGN PATENT DOCUMENTS

CN 1542847 A 11/2004
JP 2001-338993 A 12/2001
(Continued)

OTHER PUBLICATIONS

Japanese Office Action for Japanese Application No. 2019-071739, dated Jun. 10, 2020, with English translation.
(Continued)

*Primary Examiner* — Mushfique Siddique
(74) *Attorney, Agent, or Firm* — Birch, Stewart, Kolasch & Birch, LLP

(57) ABSTRACT

A semiconductor device is provided. The semiconductor can apply different voltages to sources and bases (bulks, N-type well) of pull-up transistors and improves write margin of memory cells. An SRAM of the invention includes P-well regions PW_1 and PW_2, an N-well region NW, a first metal wire M1, and a second metal wire M2. The P-well regions PW_1 and PW_2 extend in a first direction, and pull-down transistors and accessing transistors are formed therein. The N-well region NW extends in first direction, and pull-up transistors are formed therein. The first metal wire M1 extends in the first direction on the N-well region NW and is electrically connected to the N-well region NW. The second metal wire M2 extends in a second direction orthogonal to the first direction and electrically connected to a common S/D region of a pair of pull-up transistors that are formed in the N-well region NW.

20 Claims, 8 Drawing Sheets

(51) Int. Cl.
  *G11C 11/412*    (2006.01)
  *G11C 5/06*      (2006.01)
  *G11C 11/419*    (2006.01)
  *G11C 5/14*      (2006.01)
  *H01L 27/02*     (2006.01)

(52) U.S. Cl.
  CPC .......... *G11C 11/412* (2013.01); *G11C 11/419* (2013.01); *G11C 5/146* (2013.01); *H01L 27/0207* (2013.01)

(56) References Cited

U.S. PATENT DOCUMENTS

| | | | | |
|---|---|---|---|---|
| 2004/0252548 A1* | 12/2004 | Tsukamoto | ............ | H01L 27/11 365/154 |
| 2007/0076467 A1* | 4/2007 | Yamaoka | ............ | G11C 11/412 365/154 |
| 2014/0269022 A1* | 9/2014 | Xie | ............ | G11C 5/025 438/106 |
| 2016/0019946 A1* | 1/2016 | Lin | ............ | H01L 27/11 438/109 |
| 2017/0179134 A1* | 6/2017 | Liaw | ............ | H01L 29/1095 |

FOREIGN PATENT DOCUMENTS

| | | |
|---|---|---|
| JP | 2004-303340 A | 10/2004 |
| JP | 2009-199705 A | 9/2009 |
| JP | 2015-511753 A | 4/2015 |

OTHER PUBLICATIONS

Korean Office Action for Korean Application No. 10-2020-0031592, dated Dec. 21, 2020, with English translation.

* cited by examiner

A: a memory cell of an embodiment

B: a conventional memory cell

SRAM LAYOUT SCHEME FOR IMPROVING WRITE MARGIN

CROSS REFERENCE TO RELATED APPLICATIONS

This Application claims priority of Japan Patent Application No. 2019-071739, filed on Apr. 4, 2019, the entirety of which is incorporated by reference herein.

BACKGROUND OF THE INVENTION

Field of the Invention

The present invention relates to a static random access memory (SRAM), and more particularly to a layout of memory cells for improving a write margin.

Description of the Related Art

As a high-speed memory that can be read and written randomly, an SRAM is widely used in a cache memory and the like. Generally, one SRAM memory cell is composed of a pair of accessing transistors (channel gate transistors) and a latch circuit in which a pair of CMOS inverters are cross-coupled.

The write margin of the SRAM is determined by a ratio of drain currents Id of a P-type pull-up transistor and an N-channel gate transistor, which is also called Gamma Ratio. In order to increase the write margin, it is required to reduce the supply voltage Vdd provided to a memory cell, so that the current Id of the pull-up transistor becomes smaller, however, which may cause data loss in the memory cell. In order to avoid this situation, Patent Document 1 discloses that, during a write operation of a memory cell, a pulse width specified by a pulse signal is adjusted so that the supply voltage supplied to the memory cell during this period decreases dynamically.

Prior Technical Documents

Patent Documents

[Patent Document 1] Japan Publication No. 2015-511753.
FIG. 1 shows a circuit configuration of a conventional SRAM memory cell. The memory cell is composed of six transistors: pull-up PMOS transistors P1 and P2, pull-down NMOS transistors N1 and N2, and accessing NMOS transistors N3 and N4. A supply voltage Vdd is applied to a substrate terminal Psub of an N-type well or an N substrate on which the PMOS transistors P1 and P2 are formed and to the S/D terminals of the PMOS transistors P1 and P2.

The trade-off between the write margin and the read margin of the SRAM takes a lot of effort. Lowering the supply voltage has promoted this problem. To address this problem, it is required to increase the write margin so as not to affect the read margin and the cell retention.

In order to increase the write margin, it is required to increase the ratio of the Idset of the pull-up transistors and the accessing transistors, however, which may cause the read margin to decrease. The read margin is defined as the ratio of the Idset of the pull-up transistors and the accessing transistors. This ratio is determined by the physical width/length (W/L) and the threshold Vt of the transistors. The threshold value Vt of the transistors is a function of the substrate bias voltage VSB. If the source voltages of the pull-up transistors can be changed independently of the bulk voltage only during a write operation, the write margin can be increased without affecting the read margin.

However, in the conventional memory cell layout, the problem is that the sources and bases (N-well) of the pull-up transistors are connected to each other. Thus, different voltages cannot be applied to the sources and the bases.

FIG. 4B is the layout of the conventional memory cell shown in FIG. 1. However, it should be noted here that the connection lines of the gate-to-gate coupling of the CMOS inverters, word lines, and bit lines are omitted. In the conventional SRAM memory cell shown in FIG. 4B, the metal wiring M1 extending in the column direction is electrically connected to the S/D terminal Psd of the pull-up transistors P1 and P2 through the contact CT1 and electrically connected to the substrate terminal Psub through the contact CT2, and a common voltage is applied to the S/D terminal Psd and the substrate terminal Psub. In addition, the metal wiring M1 is also connected to the metal wiring M2 through the contact CT2, and the metal wiring M2 supplies the supply voltage Vdd to the metal wiring M1.

BRIEF SUMMARY OF THE INVENTION

The present invention is to solve such an existing problem, and an object thereof is to provide a semiconductor device capable of applying different voltages to sources and bases (bulks, N-type well) of pull-up transistors. Another object of the present invention is to provide a semiconductor device capable of improving the write margin without affecting the read margin or data retention.

Means to Solve the Problems

Ae semiconductor device of the present invention comprises a memory cell array formed by a plurality of memory cells. Each memory cell comprises a latch circuit and a pair of N-type accessing transistors. The latch circuit comprises a pair of P-type pull-up transistors and a pair of N-type pull-down transistors. The semiconductor device further comprises a P-type well region, an N-type well region, a first wiring layer, and a second wiring layer. The P-type well region extends in a first direction, and the pull-down transistor and the accessing transistors are formed in the p-well region. The N-type well region extends in the first direction, and the pull-up transistors are formed in the N-type well region. The first wiring layer extends in a second direction orthogonal to the first direction and is electrically connected to a common S/D region of the pull-up transistors formed in the N-type well region. The second wiring layer extends in the first direction on the N-type well region and is electrically connected to the N-type well region.

Efficacy of the Invention

According to the present invention, the first wiring layer is provided to be electrically connected to the common S/D region of the pull-up transistors in the N-type well area, and the second wiring layer is provided to be electrically connected to the N-type well area, such that different voltages can be applied to the S/D region of the pull-up transistors and the N-type well region. In addition, by applying different voltages to the S/D region and the N-well region, the threshold value of the pull-up transistors can be controlled by the substrate bias effect during the writing operation, so that the drain currents become smaller. In addition, by reducing the voltage supplied to the sources of the pull-up transistors, the drain currents are reduced, which increase and the write margin. Moreover, during the read operation, by applying a bias voltage different from that during the write operation to the S/D region and the N-type well region, the write margin can be increased without affecting the read margin or data retention. Further, during the read operation, by increasing the voltage supplied to the sources of the pull-up transistors, the characteristic of the data retention of the memory cells can be improved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Next, embodiments of the present invention will be described in detail with reference to the drawings. A semiconductor device of the present invention may be an SRAM, or a semiconductor integrated circuit partially incorporating an SRAM (eg, a microcomputer, a processor, a logic IC, or an application-specific integrated circuit).

Embodiments

Figure 1:
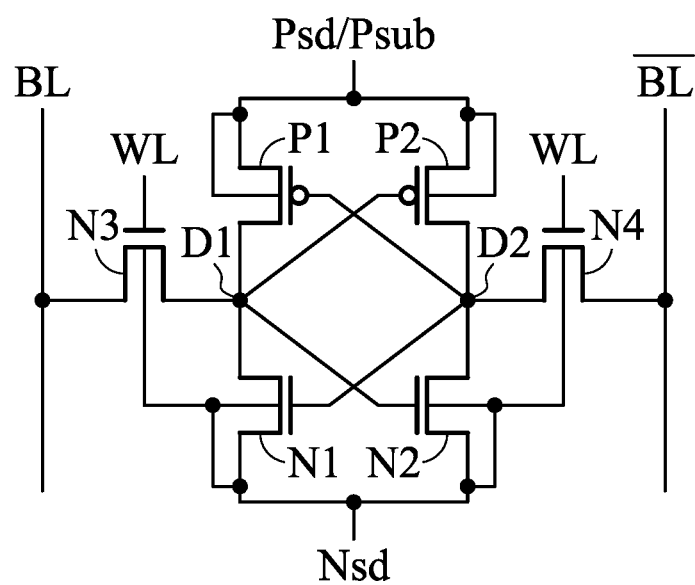
FIG. 1 shows a circuit diagram of a conventional SRAM memory cell.
Figure 2:
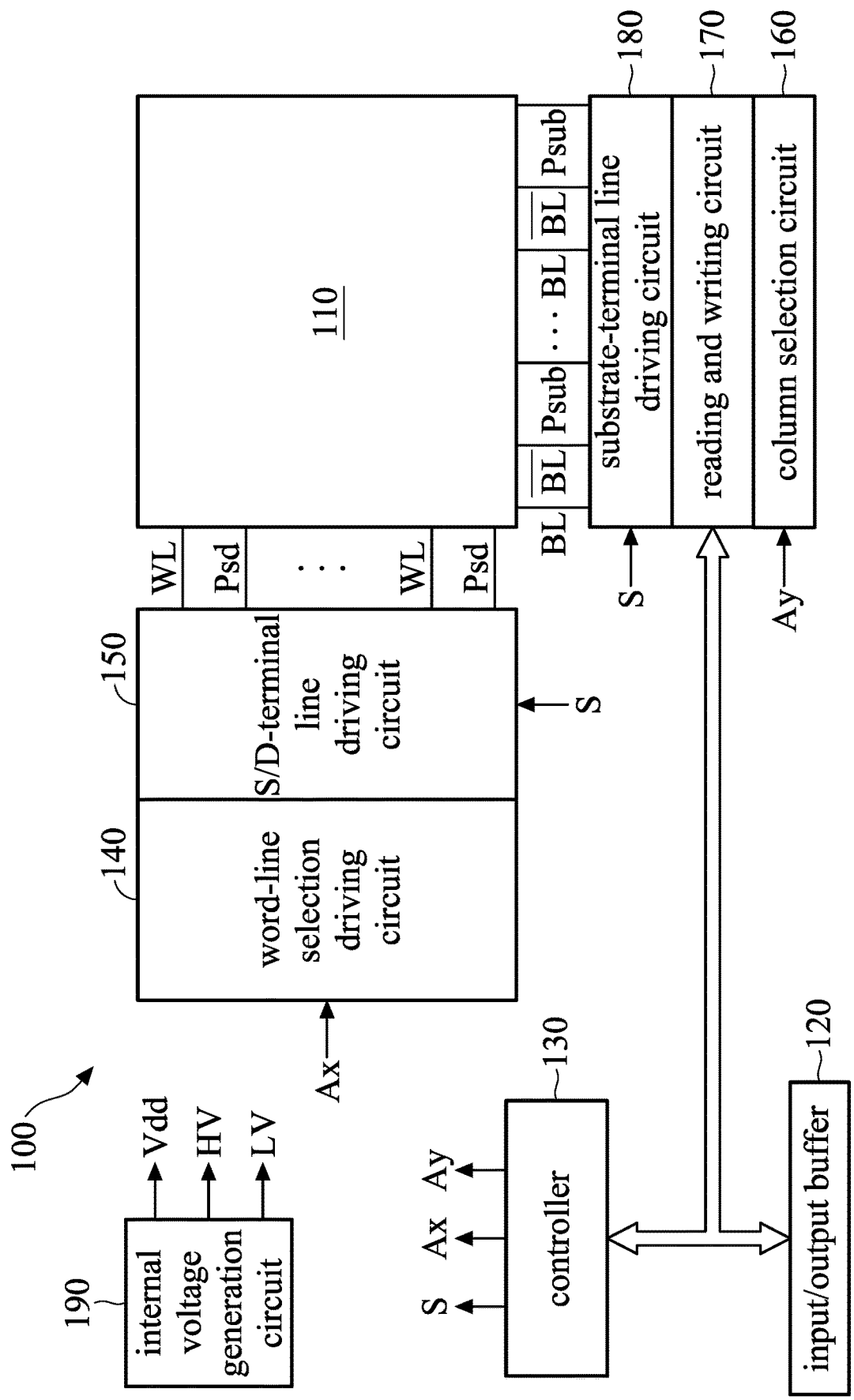
FIG. 2 shows a configuration of an SRAM according to an embodiment of the present invention.

Next, embodiments of the present invention will be described. FIG. 2 shows a configuration of an SRAM according to an embodiment of the present invention. As shown in FIG. 2, an SRAM 100 comprises a memory cell array 110 in which a plurality of memory cells are arranged in a matrix, an input/output buffer 120 which holds addresses or data, a controller 130 which controls a read operation or a write operation, a word-line selection driving circuit 140 which drives a selected word lines in response to a decoding result of row address Ax, an S/D-terminal line driving circuit 150 which drives the S/D-terminal line connected with the S/D terminals of the selected pull-up transistors in response to the decoding result of the row address Ax, a column selection circuit 160 which selects bit lines BL and BL in response to a decoding result of a column address Ay, a reading and writing circuit 170 which reads data held in a memory cell through a pair of selected bit lines and writes data into memory cell through a pair of bit lines, a substrate-terminal line driving circuit 180 which drives a substrate-terminal line connected with the substrate terminal of the selected memory cell in response to the decoding result of the column address Ay, and an internal voltage generation circuit 190 which generates a supply voltage Vdd, a high voltage HV higher than the supply voltage Vdd, and a low voltage LV lower than the supply voltage Vdd. However, the configuration shown here is a schematic example, and the present invention is not necessarily limited to this configuration.

When the SRAM 100 comprises a plurality of external terminals as external interfaces, the controller 130 controls read and write operations in response to a CS (Chip Select) signal, a WE (Write Enable) signal, or an OE (Output Enable) signals, etc. provided to the external terminals. The input/output buffer 120 receives addresses or data to be written from the external terminals or outputs the read data from external terminals. On the other hand, when the SRAM 100 is built as a part of a semiconductor integrated circuit such as a microcomputer, the CS signal, the WE signal, or the OE signal from the external terminals is not needed. In this case, the input/output buffer 120 receives a read instruction or write instruction, and the controller 130 controls the read operation or write operation in response to the received instruction.

In addition, the supply voltage Vdd may be a power supply voltage provided externally or an internal power supply voltage which is generated by a power supply voltage provided externally.

Figure 3A:
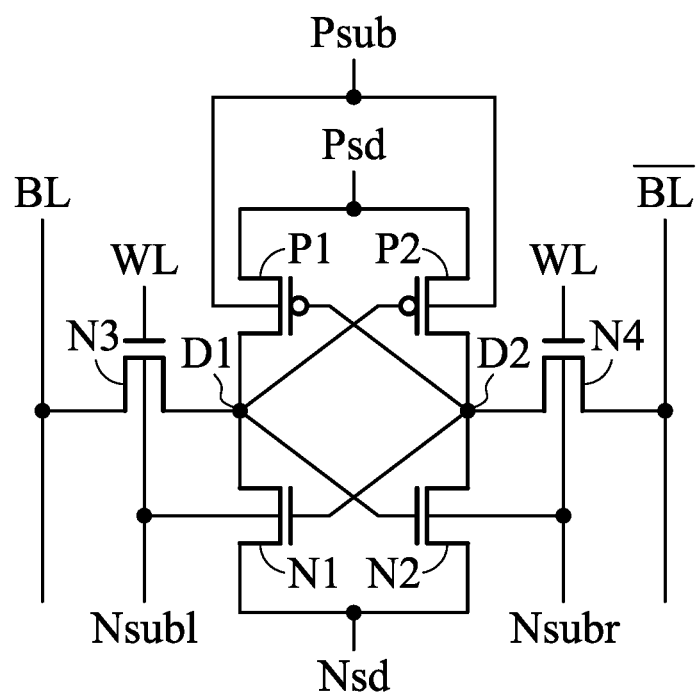
FIGS. 3A-3B are circuit diagrams showing a configuration of an SRAM memory cell according to an embodiment of the present invention.

FIG. 3A shows a configuration of one memory cell according to an embodiment. The memory cell is composed of six transistors, including pull-up PMOS transistors P1 and P2, pull-down NMOS transistors N1 and N2, and accessing NMOS transistors N3 and N4. The S/D (source/drain) on one side of the NMOS transistor N3 and the S/D (source/drain) on one side of the NMOS transistor N4 are connected to nodes D1 and D2 respectively. The S/D on the other side of the NMOS transistor N3 is connected to the bit line BL, and the S/D on the other side of the NMOS transistor N4 is connected to the bit line BL. The gates of the NMOS transistors N3 and N4 are connected to the word line WL.

The S/D on one side of the PMOS transistor P1 and the S/D on one side of the PMOS transistor P2 are connected to the S/D terminal Psd. The N-type well or N substrate where the PMOS transistors P1 and P2 are formed is connected to the substrate terminal Psub. The S/D on one side of the NMOS transistor N1 and the S/D on one side of the NMOS transistor N2 are connected to the S/D terminal Nsd. The P-type well or P substrate where the NMOS transistors N1 and N3 are formed is connected to the substrate terminal Nsubl. The N-type well or P-substrate where the NMOS transistors N2 and N4 are formed is connected to the substrate terminal Nsubr. In addition, in this embodiment, since the same voltage is supplied to the substrate terminals Nsubr and Nsubl, the substrate terminals here are regarded as the substrate terminal Nsub.

Figure 3B:
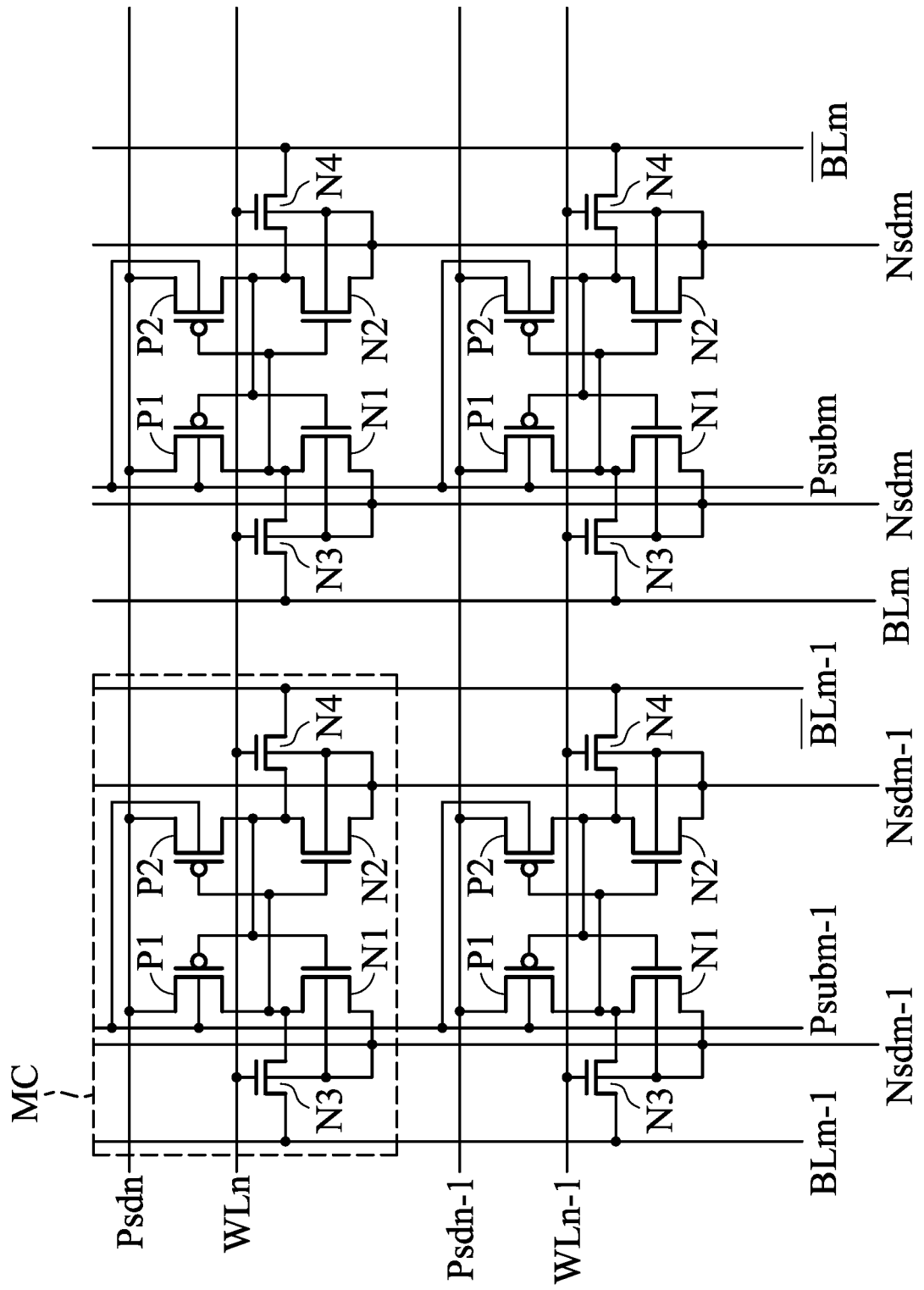

FIG. 3B shows a circuit configuration where memory cells are configured by two rows by two columns. The area MC shown by the dotted lines represents one memory cell. The gates of the accessing transistors N3 and N4 of the memory cells on the row direction are connected to the corresponding word lines WLn and WLn-1, respectively. The S/D terminals Psd of the pull-up transistors P1 and P2 of the memory cells on the row direction are connected to the corresponding S/D-terminal lines Psdn and Psdn-1 respectively. In addition, the S/D of the accessing transistors N3 and N4 of the memory cells on the column direction are connected to the bit line BLm-1/$\overline{BL}$m-1 and the bit line BLm/$\overline{BL}$m, respectively. The substrate terminals Psub of the pull-up transistors P1 and P2 of the memory cells on the column direction are connected to the corresponding substrate-terminal lines Psubm-1 and Pusubm, respectively. The substrate terminals Nsub of the pull-down transistors N1 and N2 and the accessing transistors N3 and N4 are connected to the corresponding substrate-terminal lines Nsubm-1 and Nsubm, respectively.

Figure 4A:
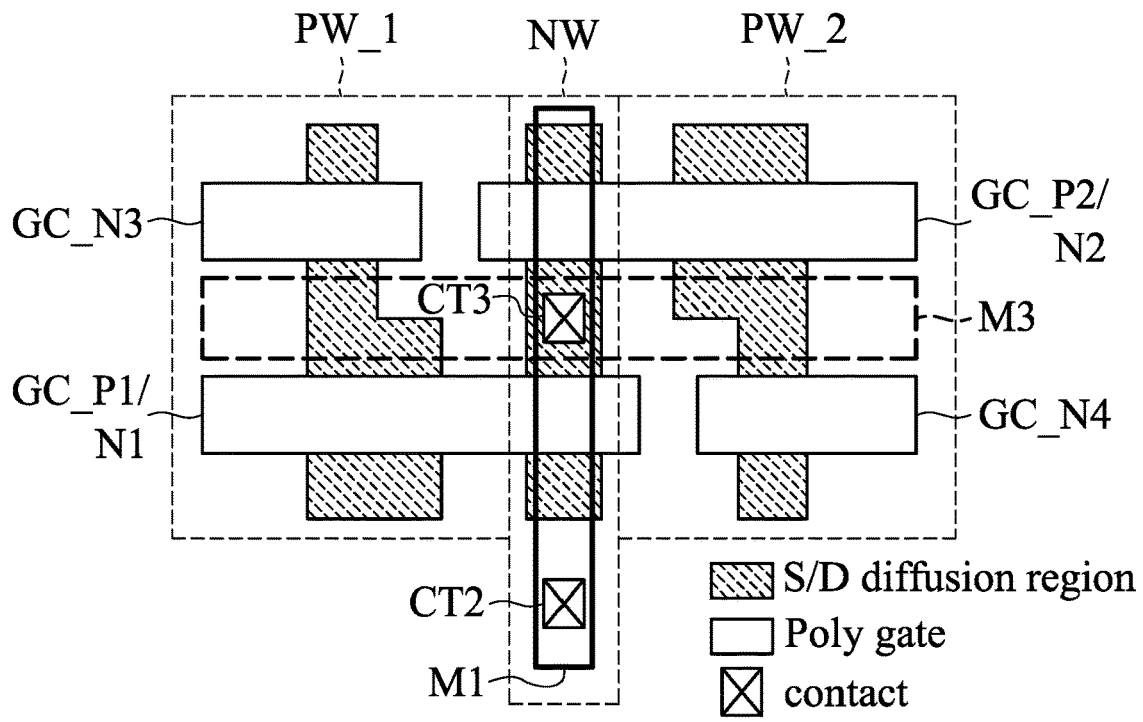
FIG. 4A shows a layout of an SRAM memory cell of the present invention.

Next, the layout of the memory cells according to an embodiment will be described. FIG. 4A shows the layout of the memory cell of the embodiment shown in FIG. 3A connection.

Figure 4B:
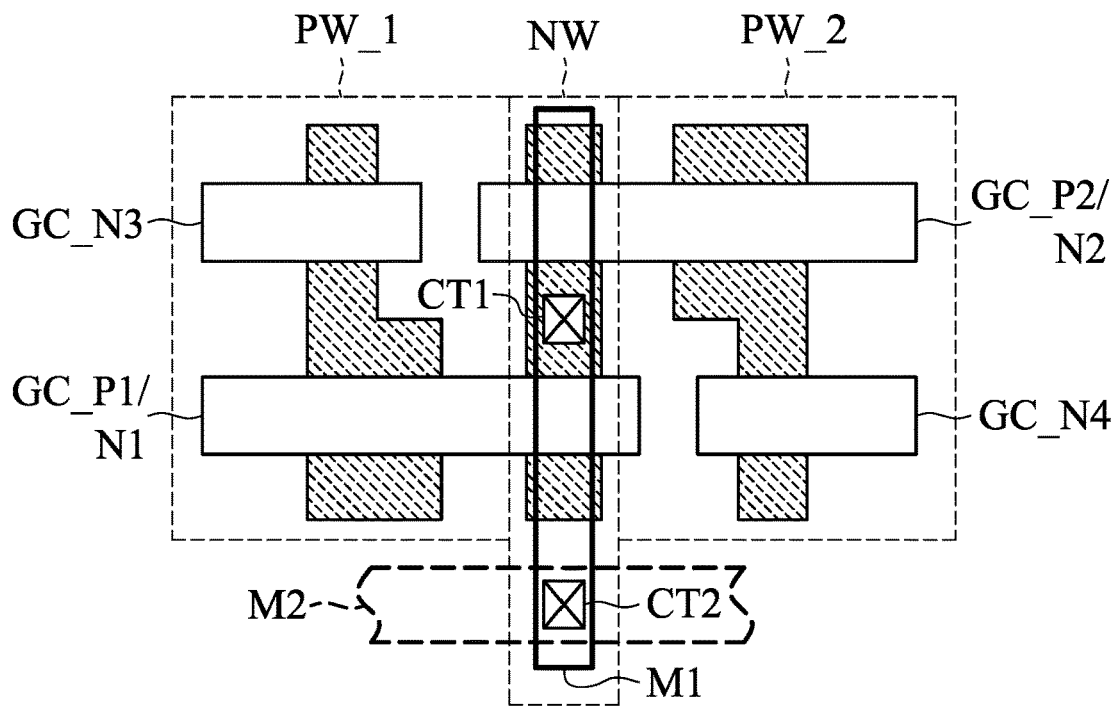
FIG. 4B shows a layout of an existing memory cell.

As shown in FIGS. 4A and 4B, two P-type well regions PW_1 and PW_2 and an N-type well region NW extending therebetween are formed on a silicon substrate. In the P-type well region PW_1, a pull-down transistor N1 and an accessing transistor N3 are formed. The speckled regions in the figure represent N-type S/D diffusion regions of two transistors. GC_N3 extending in the row direction is a polycrystalline silicon gate for accessing transistor N3. GC_P1/N1 is a polycrystalline silicon gate which is common to the pull-down transistor N1 and the pull-up transistor P1. Similarly, a pull-down transistor N2 and an accessing transistor N4 are formed in the P-well region PW_2. GC_N4 extending in the row direction is a polycrystalline silicon gate of the accessing transistor N4. GC_P2/N2 is a polycrystalline silicon gate which is common to the pull-down transistor N2 and the pull-up transistor P2.

In the N-type well region NW, two pull-up transistors P1 and P2 are formed. The polycrystalline silicon gate electrodes GC_P1/N1 and GC_P2/N2 extend from the P-type well regions PW_1 and PW_2 toward the N-type well region NW in the row direction.

In contrast with FIG. 4B, in the SRAM memory cell of the embodiment, as shown in FIG. 4A, the metal wiring M1 extending on the N-type well NW in the column direction is electrically connected to the substrate terminal. Psub (that is, N-type well NW) through the contact CT2, but is not connected to the S/D terminal Psd of the pull-up transistors P1 and P2. The S/D terminal Psd (that is, the common source region) of the pull-up transistors P1 and P2 is electrically connected to the metal wiring M3 extending in the row direction through the contact CT3. Although the metal wiring M1 and the metal wiring M3 cross each other, they are electrically separated. For example, the metal wiring M3 is located on a layer under the metal wiring M1 and is formed at the same time as the word lines, and the metal wiring M1 is formed at the same time as the bit lines.

The metal wiring M1 corresponds to the substrate-terminal lines Psubm-1 and Psubm shown in FIG. 3B, and the metal wiring M3 corresponds to the S/D-terminal lines Psdn-1 and Psdn. The substrate-terminal lines Psub0~Psubm and the bit lines BL0/$\overline{BL}$0~BLm/$\overline{BL}$m extend in the column direction on the memory cell array, and the bit lines are selected by the column selection circuit 160 based on the column address Ay, similar to the substrate-terminal lines. During a write operation, the substrate-terminal line driving circuit 180 drives a selected substrate-terminal line by a low voltage LV and drives an unselected substrate-terminal line by the supply voltage Vdd. In addition, during the read operation, the substrate-terminal line driving circuit 180 drives all the substrate-terminal lines Psub0~Psubm by the supply voltage Vdd regardless of whether at least one substrate-terminal lines are selected.

The S/D-terminal lines Psd0~Psdn and the word lines WL0~WLn extend in the row direction on the memory cell array, and the word lines are selected by the row selection/drive circuit 140 based on the row address Ax, similar ti the S/D-terminal lines. During a read operation, the S/D-terminal line driving circuit 150 drives a selected S/D-terminal line with a high voltage HV and drives an unselected S/D-terminal line by the supply voltage Vdd. In addition, during the write operation, the S/D-terminal line driving circuit 150 drives all the S/D-terminal lines Psd0~Psdn by the supply voltage Vdd regardless of whether at least one S/D-terminal line is selected.

Figure 5:
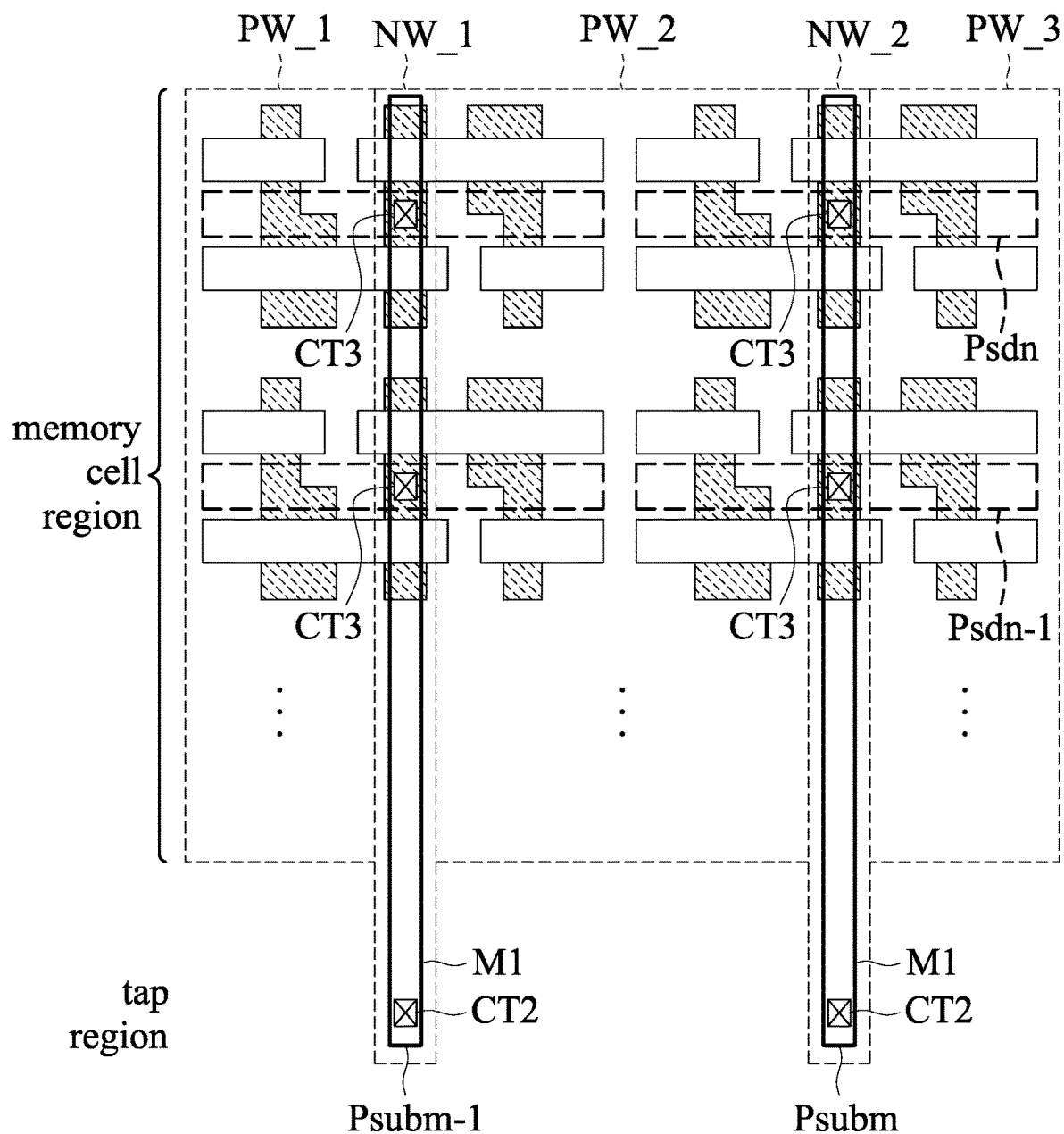
FIG. 5 shows a layout formed by a plurality of memory cells according to an embodiment of the present invention.

FIG. 5 shows a layout of memory cells arranged in two rows and two columns. P-type well regions PW_1, PW_2, and PW_3 extending in the row direction and N-type well regions NW_1, NW_2 therebetween are formed on the substrate. The central P-well region PW_2 is shared by the pull-down transistors and the accessing transistors of the two memory cells in the row direction. The two metal wirings M3 connected to the S/D terminals of the pull-up transistors correspond to the S/D-terminal lines Psdn-1 and Psdn. The S/D-terminal lines Psdn-1 and Psdn are electrically connected to the source region, which is common to the pull-up transistors, through the contact CT3.

The N-type well regions NW_1 and NW_2 span the memory cell region and extend to the tap region. The metal wiring M1 extending on the N-type well region NW_1 corresponds to the substrate-terminal line Psubm-1. The metal wiring M1 extending on the N-type well region NW_2 corresponds to the substrate-terminal line Psubm. The substrate-terminal lines Pusub-1 and Pusub are electrically connected to the N-type well regions NW_1 and NW_2 through the contact CT2 in the tap region. In addition, although an example of the memory cells arranged in two rows and two columns is shown here, a larger number of memory cells can be formed in the column direction. In addition, by increasing the P-type well area and N-type well area in the row direction, a larger number of memory cells can be formed in the row direction.

Figure 6:
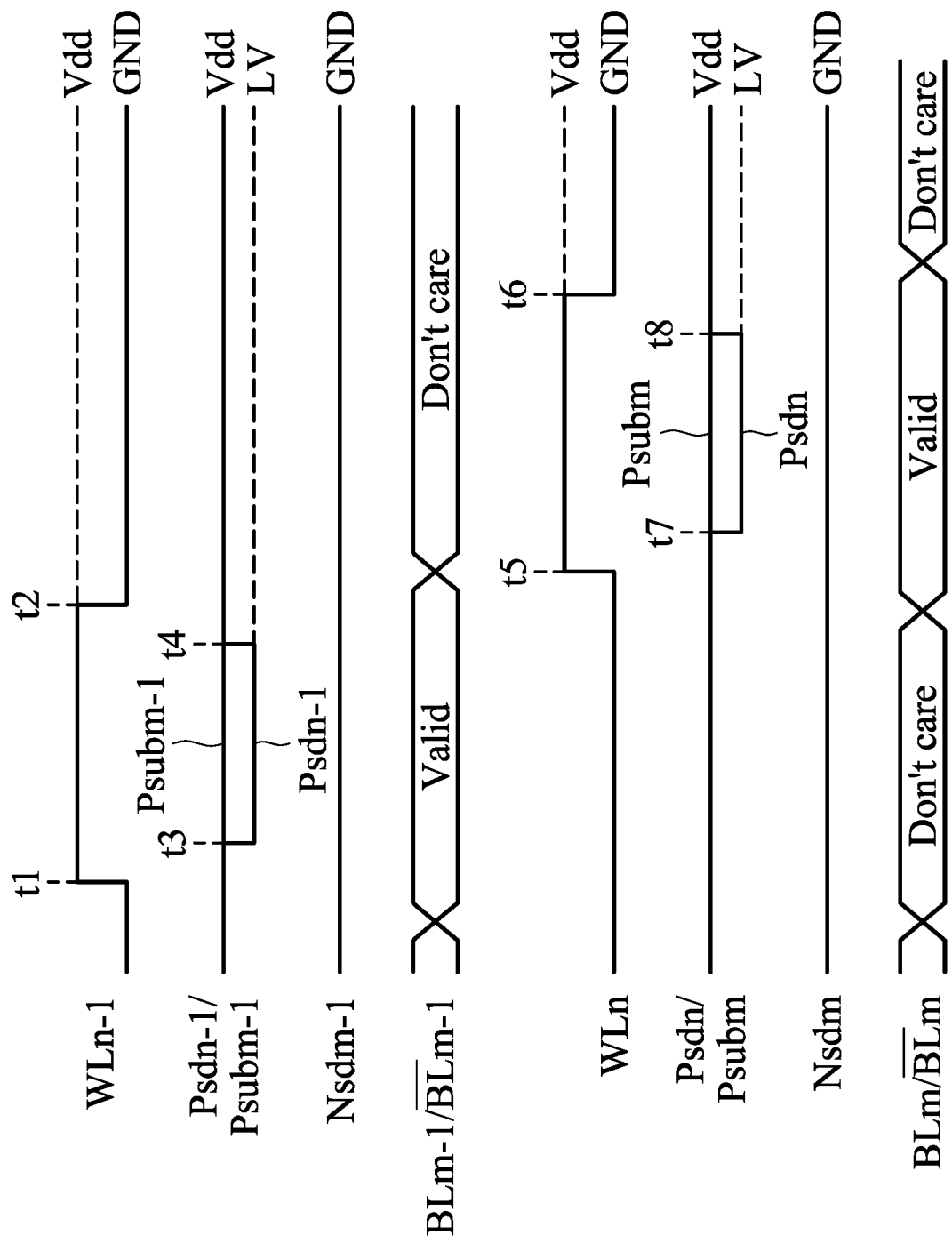
FIG. 6 is a timing chart showing a write operation of an SRAM according to an embodiment of the present invention.

Next, the write operation of the SRAM of the embodiment will be described with reference to the timing chart of FIG. 6. It is assumed that writing is performed on the memory cell in the (n−1)-th row and the (m−1)-th column, and then on the memory cell in the n-th row and the m-th column.

The row selection/driving circuit 140 selects the word line WLn-1 during a period from the time point t1 to the time point t2 and drives the word line WLn-1 by the supply voltage Vdd. Therefore, the accessing transistors N3 and N4 are turned on. Then, the S/D-terminal line driving circuit 150 selects the S/D-terminal line Psdn-1 during a period of the time point t3 to the time point t4 and drives the S/D-terminal line Psdn-1 by a low voltage LV. By setting the source voltages of the pull-up transistors P1 and P2 to the low voltage LV, the drain current is reduced as compared with the case where the source voltages are the supply voltage Vdd. The threshold value of the pull-up transistors is increased due to the substrate bias effect obtained by applying the supply voltage Vdd to the N well, which makes it difficult to turn on the pull-up transistors. As a result of the above two effects, the drain currents of the pull-up transistors are further reduced.

The reading and writing circuit 170 sets the data to be written to the selected bit lines BLm-1/$\overline{BL}$m-1 at least during the period from the time point t1 to the time point t2. The data to be written is transferred to the nodes D1 and D2 of the memory cell through the accessing transistors. At this time, since the drain currents of the pull-up transistors is decreased, the ratio of the drain currents of the pull-up transistors to the drain currents of the accessing transistors becomes large, so that the write margin increases. Therefore, the data to be written can be correctly written to the nodes D1 and D2.

The writing of the memory cell in the n-th row and the m-th column is also performed as described above. In other words, during a period from the time point t5 to the time point t6, the word line WLn is driven by the supply voltage Vdd, and during a period from the time point t7 to the time point t8, the S/D-terminal line Psdn is driven by the low voltage LV. In addition, the data to be written which is set in the bit line BLm/BLm will be correctly written into the nodes D1 and D2.

Figure 7:
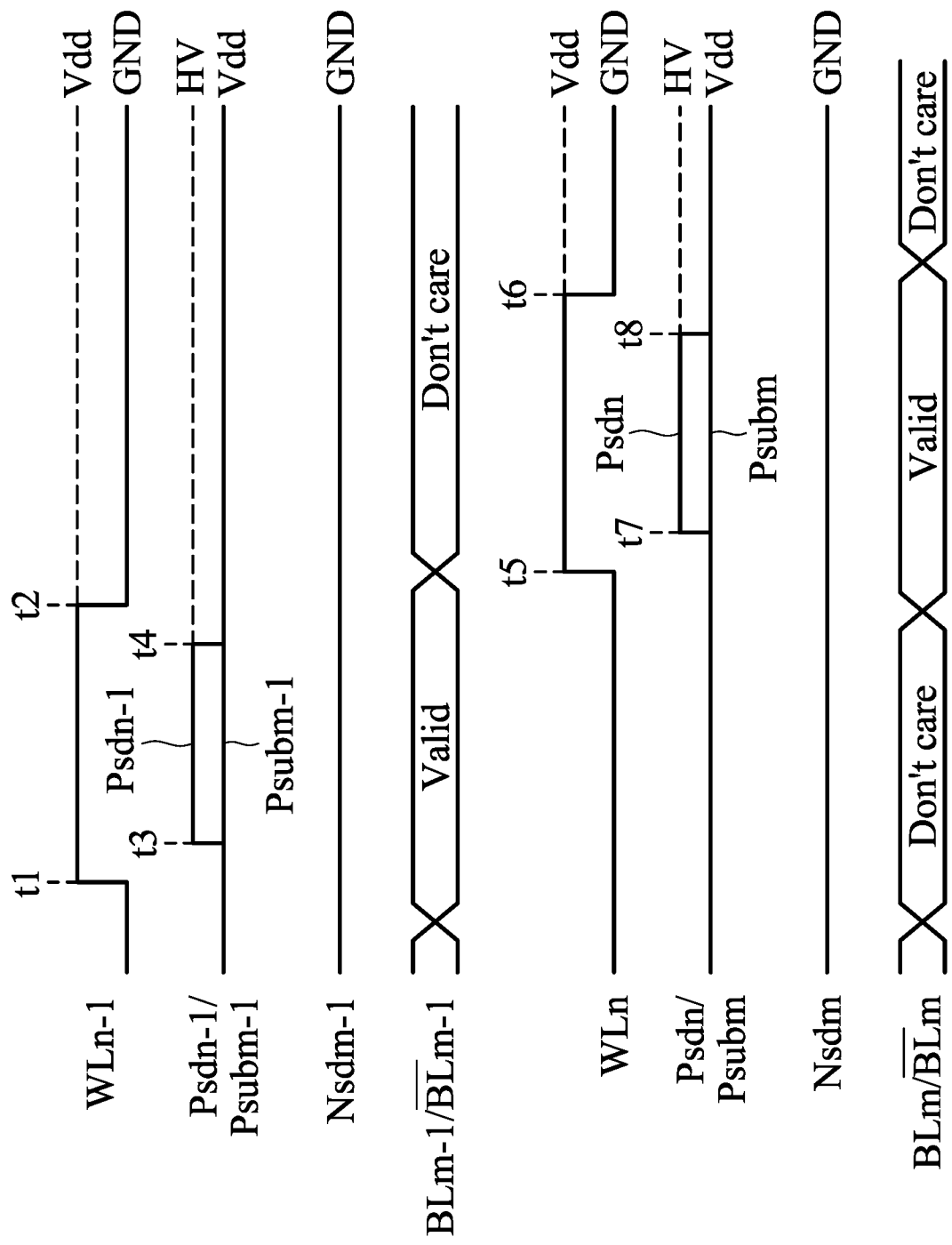
FIG. 7 is a timing chart showing a read operation of an SRAM according to an embodiment of the present invention.

Next, the read operation of the SRAM of the embodiment will be described with reference to the timing chart of FIG. 7. It is assumed that reading is performed on the memory cells in the (n−1)-th row and the (m−1)-th column, and then on the memory cells in the n-th row and the m-th column.

The row selection/driving circuit 140 selects the word line WLn-1 during a period from the time point t1 to the time point t2 and drives the word line WLn-1 by the supply voltage Vdd. Therefore, the accessing transistors N3 and N4 are turned on. Then, the S/D-terminal line driving circuit 150 selects the S/D-terminal line Psdn-1 during a period of the time point t3 to the time point t4 and drives the S/D-terminal line Psdn-1 by a high voltage HV. By setting the source voltages of the pull-up transistors P1 and P2 to the high voltage HV, the drain current can be increased as compared with the case where the source voltages are the voltage Vdd. In this way, the impact of the increase in the write margin will not affect the data retention during the read operation.

The reading/writing circuit 170 pre-charges the selected bit line BLm-1/BLm−1 to the same potential, and then, during the period form the time point t1 to the time point t2, the accessing transistors N3 and N4 are turned on. Thus, the potential corresponding to the data at the nodes D1 and D2 of the memory cell appears on the bit lines BLm-1/BLm−1 and is detected by the sense amplifier.

The reading of the memory cell on the n-th row and the m-th column is also performed as described above. In other words, during a period from the time point t5 to the time point t6, the word line WLn is driven by the supply voltage Vdd, and during the period from the time point t7 to the time point t8, the S/D-terminal line Psdn is driven by the high voltage HV. The data of the memory cell is read through the bit line BLm/BLm.

In this way, by using the layout of the memory cells of the embodiment, the threshold value Vt of the pull-up transistors is lowered in the write operation, which can increase the write margin but not affect the read margin or the data retention characteristics of the memory cell.

In addition, in the above embodiment, a combination is designed to generate the potential difference between the substrate-terminal line Psubm (N-well) and the S/D-terminal line Psdn. For example, during the write operation, the supply voltage Vdd and the low voltage LV are used, but the invention is not limited to this. In an embodiment, a combination of the high voltage HV and the supply voltage Vdd may be used. In another embodiment, a combination of the high voltage HV and the low voltage LV may be used. Similarly, during the read operation, a combination of the high voltage HV and the supply voltage Vdd is used. However, in an embodiment, a combination of the supply voltage Vdd and the low voltage LV may be used. In another embodiment, a combination of the high voltage HV and the low voltage LV may be used.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising a memory cell array formed by a plurality of memory cells, each of the memory cells comprising a latch circuit and a pair of N-type accessing transistors, the latch circuit comprising a pair of P-type pull-up transistors and a pair of N-type pull-down transistors, and the semiconductor device comprising:
   a P-type well region extending in a first direction, wherein the pull-down transistors and the accessing transistors are formed in the P-type well region;
   an N-type well region extending in the first direction, wherein the pull-up transistors are formed in the N-type well region;
   a first wiring layer disposed on the P-type well region and the N-type well region, extending in a second direction orthogonal to the first direction, and electrically connected to a common S/D region of the pull-up transistors formed in the N-type well region; and
   a second wiring layer extending in the first direction on the N-type well region and electrically connected to the N-type well region,
   wherein during a write operation, a first voltage is applied to the S/D region through the first wiring layer, a second voltage is applied to the N-type well region through the second wiring layer, and wherein during a write operation, the first voltage is lower than the second voltage, and
   wherein during a read operation, a third voltage is applied to the S/D region through the first wiring layer, a fourth voltage is applied to the N-type well region through the second wiring layer, and wherein during a read operation, the third voltage is higher than the fourth voltage.

2. The semiconductor device as claimed in claim 1, wherein the P-type well region comprises:
   a first P-type well region, wherein the pull-down transistor and the accessing transistor on one side are formed in the first P-type well region; and
   a second P-type well region, wherein the pull-down transistor and the accessing transistor on the other side are formed in the second P-type well region,
   wherein the N-type well region is disposed between the first P-type well region and the second P-type well region.

3. The semiconductor device as claimed in claim 1, wherein the first wiring layer is electrically separated from the second wiring layer, and the first wiring layer is located above or below the second wiring layer.

4. The semiconductor device as claimed in claim 1, further comprising:
   a word line extending in the second direction in the P-type well region and the N-type well region and electrically connected to gates of the accessing transistors; and
   a bit line extending in the first direction on the P-type well region and electrically connected to an S/D region of one of the accessing transistors.

5. The semiconductor device as claimed in claim 1, further comprising,
a writing device configured to write data into a selected memory cell;
wherein the writing device applies the first voltage and the second voltage.

6. The semiconductor device as claimed in claim 1, further comprising:
a reading device configured to read data from a selected memory cell,
wherein the reading device applies the third voltage and the fourth voltage.

7. The semiconductor device as claimed in claim 5, further comprising:
a word-line selection device configured to select a word line based on a row address and turn on the accessing transistors;
wherein the writing device applies the first voltage in a preset period through the word-line selection device during a period in which the accessing transistors are turned on.

8. The semiconductor device as claimed in claim 7, wherein the reading device applies the third voltage in a preset period passes through the word-line selection device during the period in which the accessing transistors are turned on.

9. The semiconductor device as claimed in claim 5, wherein the writing device selects one first wiring layer from a plurality of first wiring layers based on a row address, selects one second wiring layer from a plurality of second wiring layers based on a column address, applies the first voltage to the selected first wiring, and applies the second voltage to the selected second wiring layer.

10. The semiconductor device as claimed in claim 6, wherein the reading device selects one first wiring layer from a plurality of first wiring layers based on a row address, selects one second wiring layer from a plurality of second wiring layers based on a column address, applies the third voltage to the selected first wiring layer, and applies the fourth voltage to the selected second wiring layer.

11. A semiconductor device comprising:
a memory cell array formed by a plurality of memory cells, wherein each of the memory cells comprises
a first N-type accessing transistor coupled between a first bit line and a first node;
a second N-type accessing transistor coupled between a second bit line and a second node;
a first P-type pull-up transistor coupled to between a first S/D terminal and the first node;
a second P-type pull-up transistor coupled to between the first S/D terminal and the second node;
a first N-type pull-down transistor coupled between the first node and a second S/D terminal; and
a second N-type pull-down transistor coupled between the second node and the second S/D terminal;
a P-type well region extending in a first direction, wherein the first and second N-type pull-down transistors and the first and second N-type accessing transistors are formed in the P-type well region;
an N-type well region extending in the first direction, wherein the first and second P-type pull-up transistors are formed in the N-type well region;
a first wiring layer disposed on the P-type well region and the N-type well region, extending in a second direction orthogonal to the first direction, and electrically connected to the first S/D terminal; and
a second wiring layer disposed on the N-type well region, extending in the first direction, and electrically connected to the N-type well region,
wherein a gate of the first N-type accessing transistor, a gate of the second P-type pull-up transistor, and a gate of the second N-type pull-down transistor are disposed on a first side of the first wiring layer, and a gate of the second N-type accessing transistor, a gate of the first P-type pull-up transistor, and a gate of the first N-type pull-down transistor are disposed on a second side of the first wiring layer opposite to the first side of the first wiring layer.

12. The semiconductor device as claimed in claim 11, wherein the P-type well region comprises:
a first P-type well region, wherein the first N-type pull-down transistor and the first N-type accessing transistor are formed in the first P-type well region; and
a second P-type well region, wherein the second N-type pull-down transistor and the second N-type accessing transistor are formed in the second P-type well region,
wherein the N-type well region is disposed between the first P-type well region and the second P-type well region.

13. The semiconductor device as claimed in claim 11, wherein the first wiring layer is electrically separated from the second wiring layer, and the first wiring layer is located above or below the second wiring layer.

14. The semiconductor device as claimed in claim 1, further comprising:
a word line extending in the second direction in the P-type well region and the N-type well region and electrically connected to gates of the first and second N-type accessing transistors,
wherein the first and second bit lines extend in the first direction on the P-type well region and electrically connected to the first S/D terminal.

15. The semiconductor device as claimed in claim 11, further comprising,
a writing device configured to write data into a selected memory cell;
wherein the writing device applies a first voltage to the first S/D terminal through the first wiring layer and applies a second voltage to the N-type well region through the second wiring layer, and;
wherein the first voltage is lower than the second voltage.

16. The semiconductor device as claimed in claim 11, further comprising:
a reading device configured to read data from a selected memory cell,
wherein during a read operation, the reading device applies a third voltage to the first S/D terminal through the first wiring layer and applies a fourth voltage to the N-type well region through the second wiring layer, and
wherein during the read operation, the third voltage is equal to or higher than the fourth voltage.

17. The semiconductor device as claimed in claim 15, further comprising:
a word-line selection device configured to select a word line based on a row address and turn on the first and second N-type accessing transistors;
wherein the writing device applies the first voltage in a preset period through the word-line selection device during a period in which the first and second N-type accessing transistors are turned on.

18. The semiconductor device as claimed in claim 17, wherein the reading device applies the third voltage in a preset period passes through the word-line selection device during the period in which the first and second N-type accessing transistors are turned on.

19. The semiconductor device as claimed in claim 15, wherein the writing device selects one first wiring layer from a plurality of first wiring layers based on a row address, selects one second wiring layer from a plurality of second wiring layers based on a column address, applies the first voltage to the selected first wiring, and applies the second voltage to the selected second wiring layer.

20. The semiconductor device as claimed in claim 16, wherein the reading device selects one first wiring layer from a plurality of first wiring layers based on a row address, selects one second wiring layer from a plurality of second wiring layers based on a column address, applies the third voltage to the selected first wiring layer, and applies the fourth voltage to the selected second wiring layer.

\* \* \* \* \*